(12) United States Patent
Fumo et al.

(10) Patent No.: US 8,236,373 B2
(45) Date of Patent: Aug. 7, 2012

(54) METHOD FOR CONTROLLED INK-JET SPREADING OF POLYMERS FOR THE INSULATION AND/OR PROTECTION OF PRINTED CIRCUITS

(75) Inventors: Cesare Fumo, Gorizia (IT); Jozef Vodopivec, Gorizia (IT)

(73) Assignee: New System SRL, Gorizia (IT)

( * ) Notice: Subject to any disclaimer, the term of this patent is extended or adjusted under 35 U.S.C. 154(b) by 331 days.

(21) Appl. No.: 11/125,482

(22) Filed: May 10, 2005

(65) Prior Publication Data
US 2005/0263875 A1  Dec. 1, 2005

Related U.S. Application Data

(63) Continuation of application No. PCT/IT03/00709, filed on Oct. 31, 2003.

(51) Int. Cl.
*B05D 5/12* (2006.01)
(52) U.S. Cl. .......... 427/96.2; 427/284; 427/467
(58) Field of Classification Search .......... 427/96.1, 427/284, 402, 466–468, 96.2
See application file for complete search history.

(56) References Cited

U.S. PATENT DOCUMENTS

| | | | | |
|---|---|---|---|---|
| 3,508,984 A * | 4/1970 | Travis | .............................. | 216/13 |
| 5,683,924 A * | 11/1997 | Chan et al. | ..................... | 438/300 |
| 6,320,137 B1 | 11/2001 | Bonser et al. | ................. | 174/255 |
| 6,599,582 B2 * | 7/2003 | Kiguchi et al. | ............... | 427/466 |
| 6,710,381 B1 * | 3/2004 | Huang et al. | .................. | 257/217 |
| 6,877,853 B2 * | 4/2005 | Kiguchi et al. | ............... | 347/102 |
| 7,114,802 B2 * | 10/2006 | Kiguchi et al. | ............... | 347/101 |
| 2001/0041250 A1 * | 11/2001 | Werkhoven et al. | .......... | 428/212 |

FOREIGN PATENT DOCUMENTS

| | | |
|---|---|---|
| EP | 0930 641 A2 | 7/1999 |
| GB | 2330 331 A | 4/1999 |
| JP | 2000-353594 | * 12/2000 |

OTHER PUBLICATIONS

International Search Report, Mar. 10, 2004.

* cited by examiner

*Primary Examiner* — Brian K Talbot
(74) *Attorney, Agent, or Firm* — Sughrue Mion, PLLC

(57) ABSTRACT

Method for the controlled ink-jet spreading of polymeric material for insulation and/or protection of printed circuits, characterized in that it has at least the following steps: —carrying out at least a first bedding/bordering/border-line contour run of the circuit design, creating a line of outline/bordering design slightly raised from said printed board surface; —carrying out a subsequent filling/covering run of the outlined bordered design.

2 Claims, 1 Drawing Sheet

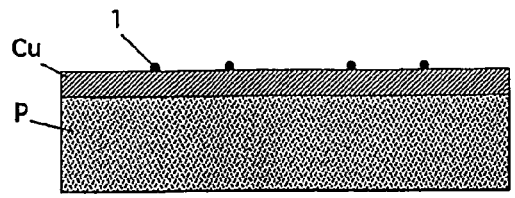 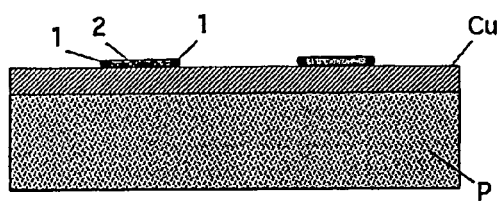
FIG.1  FIG.2
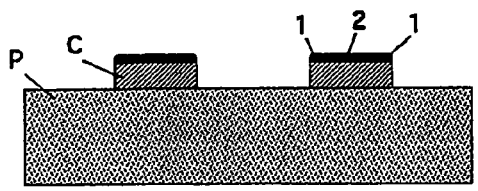 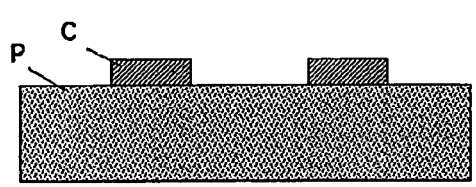
FIG.3  FIG.4
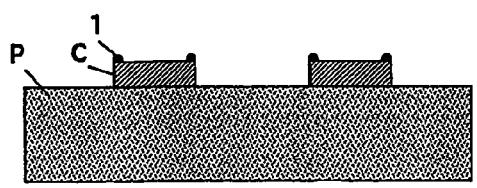 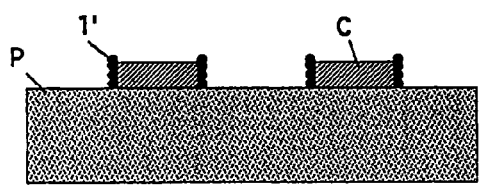
FIG.5  FIG.5A
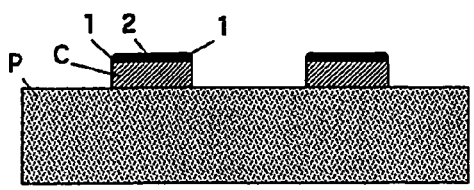 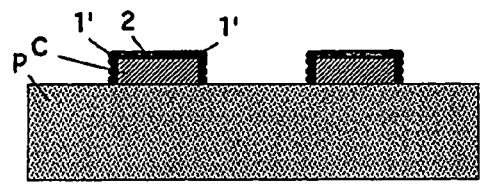
FIG.6  FIG.6A
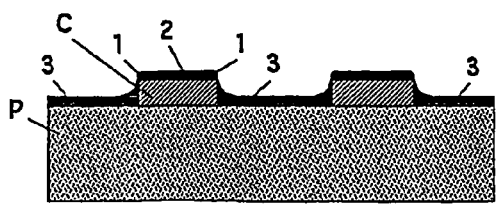 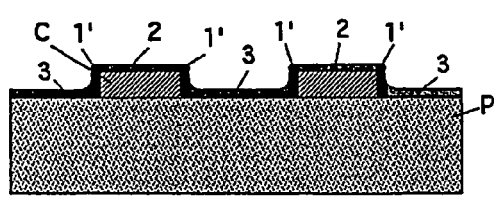
FIG.7  FIG.7A

METHOD FOR CONTROLLED INK-JET SPREADING OF POLYMERS FOR THE INSULATION AND/OR PROTECTION OF PRINTED CIRCUITS

This application is a continuation of pending International Patent Application No. PCT/IT2003/000709 filed Oct. 31, 2003, which designates the United States and claims priority of pending Italian Patent Application No. UD2002A000238 filed Nov. 11, 2002.

BACKGROUND OF THE INVENTION

This invention relates to a method for the controlled ink-jet spreading of polymers for insulation and/or protection of printed circuits, according to the preamble of the main claim.

1. Technical Field

The method finds particular and useful application in the manufacturing processes of printed circuit electronic cards.

2. Background Art

At present various manufacturing methods are known for printed-circuit electronic cards.

Particular reference is made here to the cards made up of a sheet of plastic material for example plastic reinforced with fiberglass with a layer of electrically conductive material placed on the surface such as, for example, copper, said sheets being later cut into the dimension and profile of the desired card.

The copper surface is then subjected, using different techniques (curtain coating, sprinkling, etc.), to the deposition of the printed circuit design.

Subsequently the exposed external surface of the copper layer is removed, for example, with a chemical process to obtain the electronic printed circuit.

Followed by stripping, namely the removal of the protection of the design previously deposited on the printed board (card).

Finally, the spreading of a protective insulating polymeric layer takes place.

This deposition of the protective insulating polymeric layer on the printed card or board is carried out with different techniques, generally sprinkling or curtain coating.

The spreading of the layer on a stepped/engraved surface (the level of the printed board is higher than the level of the plastic surface of the card for the value of the copper layer of approximately 45 microns) involves the need to apply a substantial protective insulating layer, otherwise the corners of the circuit conductor lines might remain exposed and therefore render the card defective.

The total protection thickness implies therefore a maximum deposition of 60 microns with evident material wastage.

The result of the cards obtained is not, however, always of the highest quality and precision due to the inevitable overflow of the deposited liquid material.

The overflow is furthermore inevitable because the metal is not as absorbent as paper and despite the porosity of the plastic material it is not as high as that of the paper and for this reason it is very difficult to obtain sharp defined outlines.

Furthermore, these insulating and protective materials are expensive.

The system for covering and protecting the cards by means of silk screening is also known. However, this method is very slow and involves the use of notable material and does not allow adequate quality and precision to be obtained.

EPO 930641A (Seiko Epson Corp.) disclosed a "Pattern Formation Method and Substrate Manufacturing Apparatus".

In this document (column 15, line 40-column 16, line 20), it is disclosed the use of " . . . forming banks—in the form of dikes—that inhibit the outflow of fluid near the borders of the pattern-forming region as a physical-chemical action, . . . ".

The suggested system uses, on a single advancing printing action (FIG. 10), the formation of both banks (706) with a first treatment apparatus (306), immediately followed by an ink-jet print head (2) that ejects the ink fluid droplets (11-12) inside the pattern-forming region delimited by said banks (706). A plasma ashing, etching, or another method for bank removal is further used. The bank material (polyamides, acrylic resins, epoxy resins and the like) being conceptually different from the following ink droplets (12).

This solution has the disadvantage of using:

two deposition apparatus, one following the other (306, 2);

two different materials, one for the banks (706) and one for the main scope of the printer, namely the liquid ink (12);

additional bank-removal head following pattern-fixing (line 18-19, column 16) or a following treatment apparatus (310) by rubbing, returning the overflowing portions back to the confines of the pattern-forming region and forming a pattern (15) of a specific width (line 41 to 53 of column 16).

AIM OF THE PRESENT INVENTION

The aim of the present invention is that of increasing the quality of the product by means of higher precision technology and furthermore, by considerably reducing the amount of protective and insulating polymeric material thus reducing significantly the manufacturing costs.

A further aim of this invention is that of reducing manufacturing time whilst still improving the quality of the product.

SUMMARY OF THE INVENTION

The problem is solved with a method for the controlled ink-jet spreading of polymers for insulation and/or protection of printed circuits according to the characterizing part of the main claim.

Therefore, using a first border-contour deposition (bedding deposition) to contour or border or profile or delimit the deposition surfaces, before proceeding to the deposition of the layer on the surface concerned in such a manner that the last one is delimited by the first bedding deposition.

The sub-claims constitute preferred embodiments.

ADVANTAGES

Thanks to the preventive border-contour system of the design to be covered there is the great advantage of being able to add edge limits that allow the successive deposition layer to be contained so as to prevent overflowing out said previously deposited border-lines, thus obtaining absolute precision and a precise minimum thickness.

The result will be a product of a better final quality with a considerably lower amount of material used, as will be explained in the following.

Naturally, the design border-contour operation, is a bedding deposition by means of a succession of linear punctiform jets, this being obtained with the suitable calibration of polymerization rapidity, fluidity and viscosity of the material, using an almost circular deposition section or in any case at least almost semicircular, with an edge height therefore that is normally calibrated to 15 microns. In this way the deposit of the subsequent filling between the border-line edges will be contained without any danger of overflowing this delimiting "track" previously applied.

DESCRIPTION OF A PREFERRED EMBODIMENT

The invention is now described with the aid of the enclosed drawings that illustrate in a schematic cross section a portion of a printed circuit card in the specific case concerned, in an enlarged view of two electric conductor lines.

All the deposits are made by means of a pixel jet system namely with the so-called inkjet system where, in contrast, ink is sprayed in pixels (punctiform droplets) onto said insulating polymeric material for protection and/or insulation.

BRIEF DESCRIPTION OF THE DRAWINGS

FIG. 1 represents the first deposition phase of the edge of the design of the printed board on the copper layer of the card (design border-contour).

FIG. 2 represents the second filling phase with the protective and insulating material of the printed board design.

FIG. 3 represents the engraving phase, namely the removal phase of the copper layer not concerning the printed board design, exposing the underlying support material of the card, namely the plastic reinforced with fiberglass.

FIG. 4 represents the stripping phase, namely the removal phase of the protective layer placed on the surface of the design of the electrically conductive printed board (copper) left on the surface of the plastic material (plastic reinforced with fiberglass) constituting the base or supporting body of the card.

FIG. 5 represents the repetition of the design border-contour (bordering/bedding) phase for the definitive insulating and protective layering/covering (first bordering/bedding step of the two-step run) of the salient conductor surfaces of the printed board to be insulated on the upper part.

FIG. 5A represents a variant to the step in FIG. 5 in which, by subsequent border-line superimpositions, a stratification of the border-line edge is built by means of pixels from the underlying base in plastic material. In this case, the sides of the conductive circuit-strata are already insulated preliminarily.

FIGS. 6 and 6a represent respectively the following filling step of covering/filling the conductive surface between the previous bedding design border-contour or bordering lines, in the first case insulating the upper surface and in the second case providing the complete insulation of the conductors also on their side.

FIG. 7 represents the final depositing step of the lowest plastic material surface of the card between the conductors, where the insulation and protection of the sides takes place for superficial adherence (cohesion) of the protective insulating liquid that rises on the sides of the conductor, protecting them, until contact is made with the upper protection.

FIG. 7A represents the same phase as FIG. 7 but, the insulation and protection of the sides of the conductors having been carried out already, the covering layer as protection of the base is to be applied with minimal thickness, or also may be completely avoided.

DETAILED DESCRIPTION OF THE DRAWINGS

With reference to the figures, it is noted that:
"P" indicates the body of the card in plastic material such as, for example, plastic reinforced with fiberglass;
"Cu" indicates the electrically conductive copper layer placed on the surface;
"C" indicates the copper layer left after the engraving, that defines the conductive electronic printed circuit;
1 indicates the double line (bedding/border-line/bordering-track) that defines the edge or outline of the design raised by approximately 15 microns;
2 indicates the deposition of the insulation and/or protective layer on the surface of the conductive material;
3 indicates the layer of protective material applied on the plastic material of the card between the conductors (border-contours).

For purely indicative purposes, the superficial dimensions of the various layers and materials are set out below:
card (e.g., plastic reinforced with fiberglass) "P" a few millimeters;
thickness of the metallic conductor material layer (copper=Cu): 45 microns;
pixel height and width of protection polymer on the conductor layer: 15 microns;
height of the protective polymer layer on the surface of the plastic material: 5 microns.

Process a) BEDDING or BORDERING or BORDER-LINE CONTOUR: the outline of the design of the printed board on the conductor (Cu) is deposited by means of printing with successive pixel-punctiform jets (1), in such a way as to form a raised contour lines of approximately 15 microns, that polymerizes immediately (FIG. 1);
b) FILLING: the outline is filled with a filling deposit (2), by means of the same printer, covering of the interior surfaces inside the previous border-line contour (1) FIG. 2;
c) ENGRAVING: the removal of the copper layer not interested by the circuit design is provided, namely between the circuit design contour (FIG. 3);
d) STRIPPING: the removal of the protective layer applied before the engraving then follows, thus exposing the circuit conductor (C) FIG. 4;
e) BEDDING or BORDERING or BORDER-LINE CONTOUR: application of the design border-contour (1) along the edges of the conductive circuit (C), FIG. 5' 5A;
f) CONDUCTOR PROTECTION: spreading the protective insulation layer (2) on the conductive circuit surface (C), between said edges/border-lines (1), FIGS. 6' 6A;
g) Final covering (3) of the non-conductive plastic card surface (P).

In this way, it is possible to save a significant amount of material that is notoriously very expensive and at the same time obtain better quality and precision, avoiding the overflow of the polymer applied.

Advantageously, the thickness of the outline deposit is within the range of 10 and 20 microns, preferably 15 microns.

More advantageously, the height of the printed circuit is within the range of 30-60 microns, preferably around 45 microns, for which a repeated deposit on the sides of the edges would involve three deposits to cover the sides and a fourth to project over the cover of the upper surface.

Even more advantageously, the filling thickness of the spaces between the said printed circuits is in the range of 3 to 7 microns, preferably 5 microns.

The method, according to the main claim, is carried out rapidly with a fast-polymerizing/hardening material so that it protrudes/raises in thickness, the polymerization/hardening being sufficiently rapid to form a barrier/border against the liquid of subsequent filling deposition layers between them.

Advantageously the deposition of these border-contour lines is carried out in such a way as to form barrier for the following deposition, to avoid overflowing and to contain the subsequent filling layer between them.

It is evident that the profiling (border-contour) according to the profile of the design of the electrically conductive part, that in accordance with the characteristics of the principal claim, protrude/raise more or less from the surface, must first be polymerized or at least partially hardened before the filling between these "border-lines" with successive subsequent filling phase, the last one being exactly defined between the edges of the previous border-line contour deposition.

In this way the deposition of the filling will not be able to exceed/overflow said border contour lines limits already polymerized/hardened.

What is claimed is:

1. A method of encapsulation of conductors on printed circuit boards, the method comprising:

providing a printed circuit board substrate having raised conductors thereon;

subsequently employing ink jet apparatus for depositing an insulating-protective material outside of and along the periphery of at least some of said raised conductors to a height which exceeds the height of said at least some of said raised conductors, thereby defining a wall which at least partially surrounds said at least some of said raised conductors; and subsequently employing ink jet apparatus for depositing an insulating-protective material onto a top surface of said at least some of said raised conductors which are at least partially surrounded by said wall, thereby, together with said wall, encapsulating said at least some of said raised conductors which are at least partially surrounded by said wall.

2. A method of encapsulation of conductors on printed circuit boards according to claim 1, and wherein said subsequently employing ink jet apparatus for depositing an insulating-protective material outside of and along the periphery of at least some of said raised conductors and said subsequently employing ink jet apparatus for depositing an insulating-protective material onto a top surface of said at least some of said raised conductors which are at least partially surrounded by said wall employ the same insulating-protective material.

* * * * *